United States Patent
Brok et al.

(10) Patent No.: US 8,824,146 B2
(45) Date of Patent: Sep. 2, 2014

(54) DIRECTLY INJECTED FORCED CONVECTION COOLING FOR ELECTRONICS

(75) Inventors: Gerrit Johannes Hendrikus Maria Brok, Enschede (NL); Wessel Willems Wits, Zwolle (NL); Jan Hendrik Mannak, Apeldoorn (NL); Rob Legtenberg, Hengelo (NL)

(73) Assignee: Thales Nederland B.V., GD Hengelo (NL)

( * ) Notice: Subject to any disclaimer, the term of this patent is extended or adjusted under 35 U.S.C. 154(b) by 238 days.

(21) Appl. No.: 13/324,372

(22) Filed: Dec. 13, 2011

(65) Prior Publication Data

US 2012/0127661 A1 May 24, 2012

Related U.S. Application Data

(63) Continuation of application No. 12/679,868, filed as application No. PCT/EP2008/062733 on Sep. 24, 2008, now Pat. No. 8,077,464.

(30) Foreign Application Priority Data

Sep. 24, 2007 (NL) ..................... 1034420

(51) Int. Cl.

| H05K 7/20 | (2006.01) |
|---|---|
| H05K 3/10 | (2006.01) |
| H05K 1/02 | (2006.01) |
| H01L 23/467 | (2006.01) |
| G06F 1/20 | (2006.01) |

(52) U.S. Cl.
CPC ........ *H05K 1/0272* (2013.01); *H05K 2201/064* (2013.01); *H05K 2201/09072* (2013.01); *H01L 2924/01079* (2013.01); *H01L 2224/73265* (2013.01); *H01L 2924/14* (2013.01); *H01L 2224/48091* (2013.01); *H01L 2924/01013* (2013.01); *H04L 24/45* (2013.01); *H04L 2224/45124* (2013.01); *H04L 2224/45144* (2013.01); *H01L 2224/48227* (2013.01); *H05K 2201/10734* (2013.01); *H01L 23/467* (2013.01); *H01L 2924/15311* (2013.01); *H01L 2924/01322* (2013.01)
USPC ...... 361/701; 361/679.53; 361/698; 361/699; 174/252; 62/259.2; 165/80.2; 165/80.4; 165/80.5

(58) Field of Classification Search
CPC ... H01L 23/473; H01L 21/67051; G01F 1/20; F28F 29/00; F28F 2250/08; H05K 7/20336; H05K 7/20781; F04B 17/00
USPC ...................... 361/679.46–679.54, 688–699, 361/700–701, 715–722; 165/80.2, 80.4, 165/80.5, 104.32, 104.33, 104.34, 185; 174/15.1, 15.2, 16.3, 252; 257/706–727; 62/259.2; 454/184
See application file for complete search history.

(56) References Cited

U.S. PATENT DOCUMENTS

| 4,839,774 A | 6/1989 | Hamburgen |
|---|---|---|
| 5,067,047 A | 11/1991 | Azar |

(Continued)

FOREIGN PATENT DOCUMENTS

JP 11 087960 A 3/1999

OTHER PUBLICATIONS

International Search Report dated Jan. 13, 2009 issued in counterpart International Application No. PCT/EP2008/062733.

(Continued)

*Primary Examiner* — Michail V Datskovskiy
(74) *Attorney, Agent, or Firm* — Stroock & Stroock & Lavan LLP

(57) ABSTRACT

Electronic circuitry includes a circuit board and at least one component mounted on the circuit board, with the at least one component generating heat while in use. The circuit board includes one or more apertures aligned with one or more respective components, and the electronic circuitry is configured to provide, while in use, a path for coolant fluid to flow through each aperture and past the respective component.

16 Claims, 8 Drawing Sheets

(56) References Cited

U.S. PATENT DOCUMENTS

| | | | |
|---|---|---|---|
| 5,453,911 | A | 9/1995 | Wolgemuth et al. |
| 5,761,035 | A * | 6/1998 | Beise .......................... 361/699 |
| 5,901,037 | A | 5/1999 | Hamilton et al. |
| 6,262,891 | B1 | 7/2001 | Wickelmaier et al. |
| 6,840,794 | B2 | 1/2005 | Chiu |
| 6,977,346 | B2 | 12/2005 | Jairazbhoy et al. |
| 7,215,547 | B2 | 5/2007 | Chang et al. |
| 7,294,926 | B2 | 11/2007 | Schubert et al. |
| 7,372,148 | B2 | 5/2008 | Im et al. |
| 7,567,090 | B2 | 7/2009 | Cote et al. |
| 2004/0013545 | A1 * | 1/2004 | Brown et al. .............. 417/413.3 |
| 2006/0120043 | A1 | 6/2006 | Wolford |
| 2007/0103868 | A1 * | 5/2007 | Yazawa ......................... 361/699 |

OTHER PUBLICATIONS

USPTO PTO-892 Form issued in U.S. Appl. No. 12/679,866, filed Sep. 23, 2010, now U.S. Patent No. 8,077,464, issued Dec. 13, 2011.

* cited by examiner

DIRECTLY INJECTED FORCED CONVECTION COOLING FOR ELECTRONICS

CROSS-REFERENCE TO RELATED APPLICATIONS

This application is a continuation of U.S. patent application Ser. No. 12/679,868, filed Sep. 23, 2010, which is a National Phase application under 35 U.S.C. §371 of International Application No. PCT/EP2008/062733, filed on Sep. 24, 2008, which claims the benefit of Netherlands Patent Application No. 1034420, filed Sep. 24, 2007, all of which are incorporated by referenced herein. The International Application was published on Apr. 2, 2009 as WO 2009/040366.

BACKGROUND

1. Field of the Invention

The present invention relates to the cooling of electronic circuitry, and in particular to the cooling of electronic circuitry comprising a circuit board and one or more electronic components that generate heat in use and that are mounted on the circuit board.

2. Description of the Related Art

As the functionality and performance of semiconductor integrated circuits (ICs) increase, so does the amount of dissipated heat per unit of their surface area. To control the rising temperatures of components on Printed Circuit Boards, improvement in cooling performance is required.

Most mainstream electronics cooling methods rely on convection, conduction or a combination of these (radiation only plays a negligible role in cooling electronics).

A known method of cooling ICs is through forced convective cooling. However, such forced convective cooling is constrained by the fact that the generated heat has to travel from the junction of heat dissipating components through a series of thermal resistances before it finally reaches the coolant medium, at the cost of a significant temperature gradient. These thermal resistances consist of, for instance, adhesive layers, encapsulation resins, solder connections, pockets/layers of stationary air, etc.

In another known method, high-performance ICs in consumer electronics such as Central Processing Units (CPUs) and Video Controllers dissipate most of their heat through their top surface to a heat sink or a more sophisticated (active) cooling device, with minor impact on the PCB design itself. This technique has its limitations as in most cases IC package thermal resistance from the semiconductor die to the package top surface is relatively high. In the struggle to keep pace with increasing semiconductor performances, both the size and power consumption of such add-on cooling devices have, disadvantageously become increasingly large.

Moreover, in some applications the component's top surface is not even accessible, in particular when the component is an integrated sensor. In these cases, most of the heat must be dissipated through the bottom of the component into the Printed Circuit Board and initially removed through conduction. Although in many cases the bottom side of the electronic components has the lowest thermal resistance, this side cannot be directly exposed to a coolant medium because it is facing the PCB. Generally, PCBs have a poor thermal conductivity, which can be moderately improved, e.g. by adding more or thicker copper layers.

Variants of the prior art methods mentioned above have focused on improving heat transfer by reducing the magnitude of thermal resistances, for instance by improving thermal conductivity or improving heat transfer to a coolant medium. Strictly speaking, the thermal path remains essentially the same; the improvement is merely due to improvement of sub-optimal thermal resistances. The result of these approaches is a moderately reduced temperature gradient, but at the expense of more costly material compositions or more complex, additional hardware, or both. With increasing heat dissipation levels, the amount of add-on hardware and materials becomes an increasingly dominant factor in the design, and consequently also a significant cost factor.

Another known method of cooling integrated circuits relates specifically to the cooling of printed circuit board (PCB) units contained within a main housing, in which each PCB unit is, in turn, contained within its own housing within the main housing. The method is described in GB 2 382 932 and provides for the use of relatively large apertures in a PCB and its housing for passage of forced cooling air from one side of the board to the other side, thus to prevent the PCB acting as a total block to air flow from one side to the other and to improve the general airflow through the main housing. However, the method of GB 2 382 932 does not address the problem of the improvement of cooling of individual PCBs or individual components on such PCBs.

SUMMARY

It is an aim of the present invention to provide improved, or at least alternative electronic circuitry and an improved, or at least alternative, method of cooling electronic circuitry.

Thus, in a first aspect of the invention there is provided electronic circuitry comprising a circuit board and at least one component mounted on the circuit board, wherein the at least one component generates heat in use, and the circuit board includes at least one aperture aligned with the component or a respective one of the components. Preferably the electronic circuitry is configured to provide, in use, a path for coolant fluid to flow through the or each aperture and past the at least one component.

The or each component may comprise a part that generates heat in use, and further parts that dissipate the heat to the surface of the component. So, for instance, the part of an electrical current path through the component which has the highest electrical resistance and/or through which the highest electrical current flows in use may be the part of the component that generates the most heat. Usually, other parts of the component, for instance, structural or protective parts, dissipate the heat generated by the heat-generating parts.

By providing at least one aperture aligned with a component that generates heat in use, improved cooling of the electronic circuitry may be provided, as cooling effects can more efficiently be targeted at those parts of the circuitry that generate or dissipate heat.

The or each aperture may be, but is not necessarily, positioned at that point or within that region of the circuit board that is a minimum distance from the component or a respective one of the components.

The central axis of the or each aperture may be, but is not necessarily, perpendicular to the plane of the circuit board and at least one component. Preferably the or each aperture is arranged such that a straight line extending out of the aperture along the central axis of the aperture would pass through the component with which the aperture is aligned. Preferably the or each aperture is arranged such that, in use, coolant fluid exits the aperture towards the component with which the aperture is aligned.

A respective more than one aperture may be aligned with the or each heat-generating component. For the or each component, the number of apertures aligned with the component and their total cross-sectional area may be selected in dependence upon the rate of heat generation by the component expected in use.

The coolant fluid may be liquid or gas. The coolant fluid may be water. The coolant fluid may comprise a dielectric fluid, for example poly-alpha-olefin (PAO), or an inert gas, for instance nitrogen. Preferably the coolant fluid is air. In some circumstances, the coolant fluid may be supplied from a pressurized source, for instance a pressurized gas cylinder.

Preferably the circuit board is a printed circuit board (PCB).

Preferably the circuitry is configured such that in use the coolant fluid is in contact with the at least one component. Preferably the or each aperture is aligned with an area of the component that dissipates the most heat when in use.

The component may comprise any type of electrical or electronic circuit or microcircuit or a combination thereof. The component may comprise semiconductor material together with surrounding material and electrical contacts. The component may comprise, for instance, a chip. The component may be a device that can be mounted individually on a circuit board using area array techniques, such as ball grid array (BGA), land grid array (LGA), pin grid array (PGA), stud bump array (SBA), or quad flat-no leads (QFN) array techniques. Preferably, the electronic circuitry is arranged so that in use the or each heat-generating component dissipates heat primarily through a side facing the circuit board.

The electronic circuitry may comprise a plurality of components that generate heat in use and a plurality of apertures, wherein each of the plurality of apertures is aligned with a respective one of the plurality of components.

Thus, improved cooling may be provided to an array of components that generate heat in use.

Preferably, the electronic circuitry comprises means for providing different relative flow rates of coolant through different ones of the apertures.

At least some of the apertures may have different sizes. The apertures may have different diameters. Preferably the provision of apertures at least some of which have different sizes comprises partially restricting at least some of the apertures. Preferably, the size of each aperture is selected in dependence upon the expected rate of heat generation or dissipation of the component with which the aperture is aligned.

The position of the or each aperture may be such as to provide, in use, greater flow of coolant fluid past the at least one component with which the or each aperture is aligned than past other parts of the electronic circuitry.

So, for instance, greater flow of coolant fluid may be provided past components that generate heat in use than past regions of the circuit board between the components, or past components that generate substantially no heat in use, or that generate heat at less than a certain rate in use. Preferably, the electronic circuitry is arranged so that for each aperture, in use, coolant fluid flows past the component with which the aperture is aligned before other components.

Preferably the at least one component is spaced apart from the circuit board by a desired spacing. Thus a flow path for the coolant fluid may be provided between the at least one component and the circuit board. The desired spacing may be selected in order to provide, in use, a desired rate of coolant flow past the or each component and/or a desired cooling effect.

The electronic circuitry may further comprise at least one spacer for spacing the at least one component apart from the circuit board by the desired spacing.

The at least one spacer may comprise at least one electrical or mechanical connection between the at least one component and the circuit board. Preferably the at least one electrical or mechanical connection comprises solder. Electrical and mechanical connections, such as solder connections, which would anyway be required may have an additional function by also acting as spacers. Thus, there is provided a particularly simple construction for the electrical circuitry.

The shape of the circuit board may be adapted in order to provide the desired spacing in the region of the or each aperture. Thus in the case, for example, where the dimensions of the electrical and mechanical connections do not correspond to the desired spacing, the desired spacing may be obtained by varying the shape of the circuit board. Preferably the height or thickness of the printed circuit board varies in the region of the aperture.

The respective desired spacing for the or each component may be selected in dependence upon the expected rate of heat generation of the component in use.

The spacing between the at least one component and the circuit board may be between 0.1 mm and 5 mm, and preferably is between 0.5 mm and 1.0 mm.

The diameter of the or each aperture may be between 0.1 mm and 10 mm, preferably between 0.5 mm and 5 mm, and more preferably between 1 mm and 3 mm.

Optionally the electronic circuitry further comprises means (for instance a shutter arrangement) for varying the size of the or each aperture.

The position of the or each aperture may be such that, in use, coolant fluid passing through the aperture approaches the surface of the component with which the aperture is aligned from a perpendicular direction.

Thereby a jet impingement effect may be provided such that, preferably, the coolant fluid breaks through a respective thermal boundary layer next to the or each at least one heat generating component. Such thermal boundary layers are stable layers of air or other fluid which may build up next to the or each component and which exhibit a temperature gradient away from the component. The presence of such thermal boundary layers can reduce convective cooling effects.

The electronic circuitry may further comprise at least one further aperture, and the at least one aperture and the at least one further aperture may be arranged so that coolant fluid can flow in through the at least one aperture and out through the at least one further aperture or vice versa.

The or each at least one further aperture may be, for instance, an aperture in the circuit board or an aperture between components or an aperture between the circuit board and the at least one component.

There may be a closed path between the aperture and the at least one further aperture. Preferably the electronic circuitry comprises sealing means around the or each said heat-generating component arranged so as to provide the closed path between the aperture and the at least one further aperture. The sealing means may comprise a layer or layers of solder between the circuit board and the or each said heat-generating component. The sealing means may be arranged to provide a closed-path type cooling circuit. In contrast, preferably sealing means are not provided if an open-path type cooling circuit is provided.

The electronic circuitry may include a heat exchange circuit comprising means for passing coolant fluid through the at least one aperture and past the at least one component.

The heat exchange circuitry may include a pressure chamber in communication with the aperture or at least one of the apertures.

Preferably each of the apertures is in communication with the pressure chamber. Preferably, in operation the coolant fluid passes from the pressure chamber, through the or each aperture and past the at least one component. Preferably the pressure chamber is arranged such that, in use, the coolant fluid experiences a drop in pressure as it passes out of the pressure chamber, thus providing a further cooling effect.

Preferably the apertures are sufficiently small that the pressure chamber provides fluid to the apertures at isostatic pressure.

The heat exchange circuit may comprise a heat exchanger and may be arranged so that in use heat is passed from the at least one component to the coolant fluid and heat is subsequently expelled from the coolant fluid at the heat exchanger.

The heat exchange circuit may be a closed-loop heat exchange circuit. Thus, in operation the coolant fluid may be passed around the heat exchange circuit a plurality of times.

Alternatively, the heat exchange circuit may be an open loop heat exchange circuit. In that case the heat exchange circuitry may not include a heat exchange unit or heat exchanger where heat can be transferred from the coolant fluid. Instead heat may be expelled merely by expulsion of the coolant fluid, for instance to ambient, after its passage past the at least one component.

The electronic circuitry may comprise a structure located between the at least one component and the circuit board, arranged so as, in use, to increase heat transfer between a coolant fluid and the at least one component.

The structure may be in conductive thermal contact with the at least one component and provide a surface area for exchange of heat from the at least one component to the coolant fluid.

Thereby an increased surface area for contact—and thus exchange of heat—with the coolant fluid may be provided compared to the surface area provided by the at least one component in the absence of the structure. The structure may comprise metallic material, and preferably comprises solder.

The electronic circuitry may comprise an area array arrangement, preferably a ball grid array (BGA), a land grid array (LGA), a pin grid array (PGA), a stud bump array (SBA), or a quad flat-no leads (QFN) array.

The electronic circuitry may comprise, for instance, server computers featuring multiple parallel CPU's on one PCB, or power amplifier circuits for, for instance, telecom base stations featuring a cascade of high power transistor circuits.

In a further, independent aspect there is provided a method of producing electronic circuitry comprising providing a circuit board, producing at least one aperture in the circuit board, and mounting at least one component on the circuit board, wherein the at least one component dissipates heat in use and the or each aperture has a position on the circuit board such that it or they are aligned with a respective one of the mounted components and such that, in use, a path for coolant fluid to flow through the or each aperture and past the at least one component is provided.

The step of producing the at least one aperture may comprise drilling or punching a hole or holes in the circuit board before mounting the at least one component.

In the case where the electronic circuitry comprises a grid array arrangement preferably the positions of the holes are at the centre of the grid array. For instance in the case of a ball grid array (BGA) arrangement, preferably the position of the holes correspond to the central position of each BGA and preferably thus correspond to the positions of the heat generating components within each BGA.

The step of mounting the at least one component may comprise positioning the at least one component on the circuit board and reflowing portions of solder in order to provide an electrical connection between the at least one component and the circuit board, and the portions of solder are such that after reflowing the portions of solder provide a desired spacing between the circuit board and the at least one component.

The method may further comprise producing a further aperture and providing at least one further portion of solder on the circuit board, and wherein the step of reflowing comprises reflowing the at least one further portion of solder, the at least one further portion of solder being positioned such that, after reflowing, it provides a barrier to coolant flow thereby to produce a closed path between at least one of the apertures and at least one of the further apertures.

Preferably there is provided one or more of the following features: —a simple design, indiscriminate to geometry of the component to be cooled; a direct path from junction to coolant medium (for instance, air); the possibility to fine-tune cooling performance per component if required, for instance to ensure temperature uniformity across a PCB; no need for special tooling or machinery; a high level of integration; compactness; design flexibility.

In the case, in particular, where the heat exchange circuit is an open loop heat exchange circuit and the coolant fluid is air, open loop air cooling is provided, which may provide better cooling performance than conventional cooling techniques, in a simple, easy-to-implement design that does not require costly materials or complex parts, and which therefore may be compact and low cost.

Preferably there is no complex hardware on top of, or around the heat dissipating components. Preferably the only dedicated feature of the circuit board is a small hole underneath every heat-dissipating component. The coolant medium may be injected directly under the "hot spot" of a component, ensuring efficient heat transfer due to elimination of several thermal resistances. In the case of multiple heat-dissipating components on one PCB, preferably a single pressure chamber acting as a manifold is provided. Fine-tuning of coolant flows may be established by restricting each aperture individually. If every component is identical, such individual restriction of apertures may not be required. Preferably, in the case of open loop air cooling, an aperture is provided underneath every heat-dissipating component and a simple pressure chamber/manifold is fed by a simple air pump.

A cooling system may be provided which is compact in an area of a circuit board near densely packed, heat dissipating components. The other side of the circuit board may be left fully, or almost fully, available for additional, low-heat dissipating electronic components.

Preferably there is provided a method to directly "inject" forced convection cooling at the bottom surface of a semiconductor package, hence very close to the heat junction, thus significantly improving cooling performance without the need to assemble any cooling hardware to the top of the component and with little impact on PCB design.

In a further, independent aspect of the invention there is provided a method of forcing a fluid (i.e. gas or liquid) flow through a small diameter hole (preferably 1 to 3 mm) in a printed circuit board located directly under a heat-dissipating component. Thus, heat can be transferred more efficiently from the component to the fluid than by means of conventional forced convection.

Any feature in one aspect of the invention may be applied to other aspects of the invention, in any appropriate combination. In particular, apparatus features may be applied to method features and vice versa.

BRIEF DESCRIPTION OF THE SEVERAL VIEWS OF THE DRAWINGS

Embodiments of the invention will now be described, by way of example only, with reference to the accompanying drawings in which.

DETAILED DESCRIPTION

Figure 1:
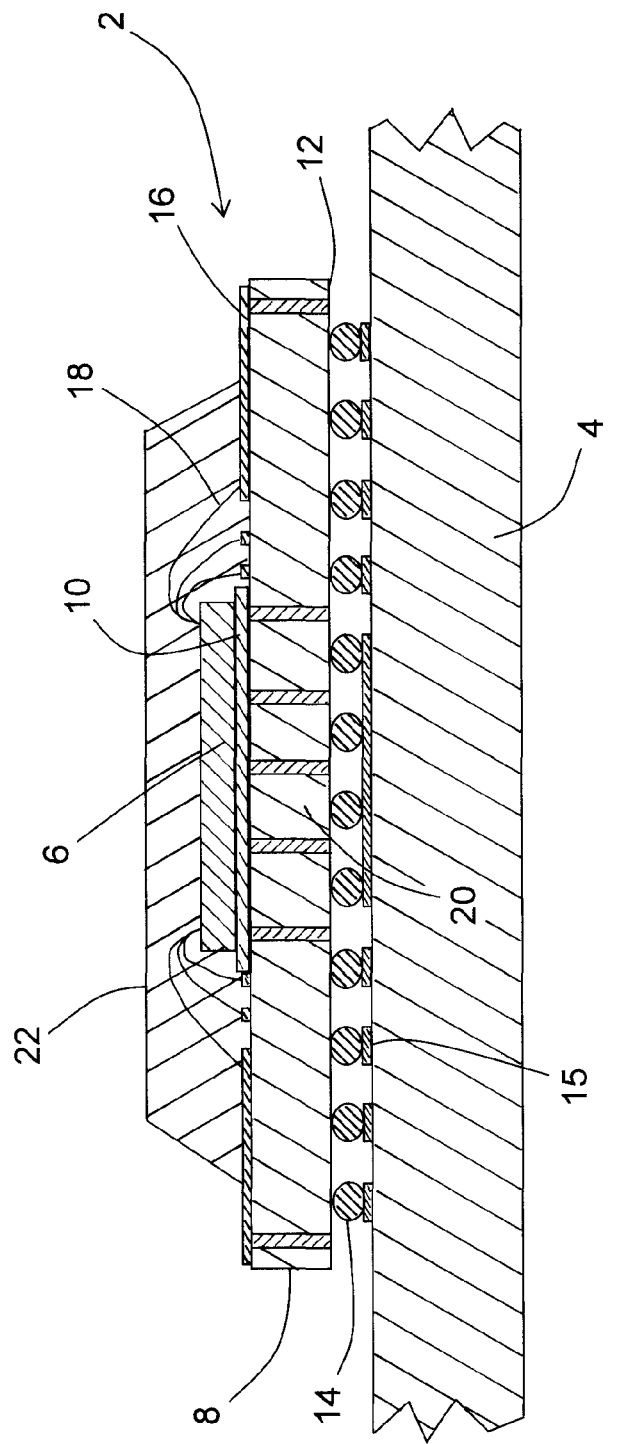
FIG. 1 is a schematic illustration of known electronic circuitry in which a ball grid array (BGA) component is soldered onto a printed circuit board (PCB)

An example of known electronic circuitry in which a ball grid array (BGA) component 2 is soldered onto a printed circuit board (PCB) 4 is shown in FIG. 1.

The component 2 comprises a semiconductor die 6 attached to a rigid laminate structure 8 by a die attach layer 10 consisting of solder or conductive adhesive. The rigid laminate structure 8 includes a bottom conducting layer 12, and the component 2 is attached to the printed circuit board 4 by solder connections 14, formed from eutectic solder balls, which attach conducting areas of the bottom conducting layer 12 to corresponding conducting areas 15 of the printed circuit board 4.

The rigid laminate structure 8 also includes a top conducting layer 16 formed using a solder mask. Bond wires 18 of gold or aluminium are used to provide electrical connections between the semiconductor die 6 and conducting areas of the top conducting layer 16. Electrical connection between those conducting areas of the top conducting layer 16 and corresponding conducting areas of the bottom conducting layer 12 is provided by conducting vias 20 which pass through the rigid laminate structure 8.

The semiconductor die 6 is encased in an encapsulation layer 22 or mold compound, which is typically formed of an encapsulation resin.

In operation, heat is generated primarily by the semiconductor die 6. The two main paths for heat conduction away from the semiconductor die 6 are through the encapsulation layer 22 to the top surface of the component 2 or through the conducting wires 18, the top conducting layer 16, the conducting vias 20, the bottom conducting layer 12, and the solder connections 14 to the printed circuit board 4.

Known cooling methods for cooling the circuit board 4 and attached components shown in FIG. 1, require either a heat sink or active cooling device in contact with the top surface of the encapsulation layer 22, or the use of convective cooling system passing a coolant fluid around the component 2 and circuit board 4. The effectiveness of the use of a heat sink or active cooling device is limited, for example, by the relatively high thermal resistance of the encapsulation layer. The effectiveness of the use of a convective cooling system is limited by the relatively high thermal resistance (through the component 2 and the printed circuit board 4) and by the restriction of coolant flow rates around the component 2 and circuit board 4 in a typical installation.

Figure 2:
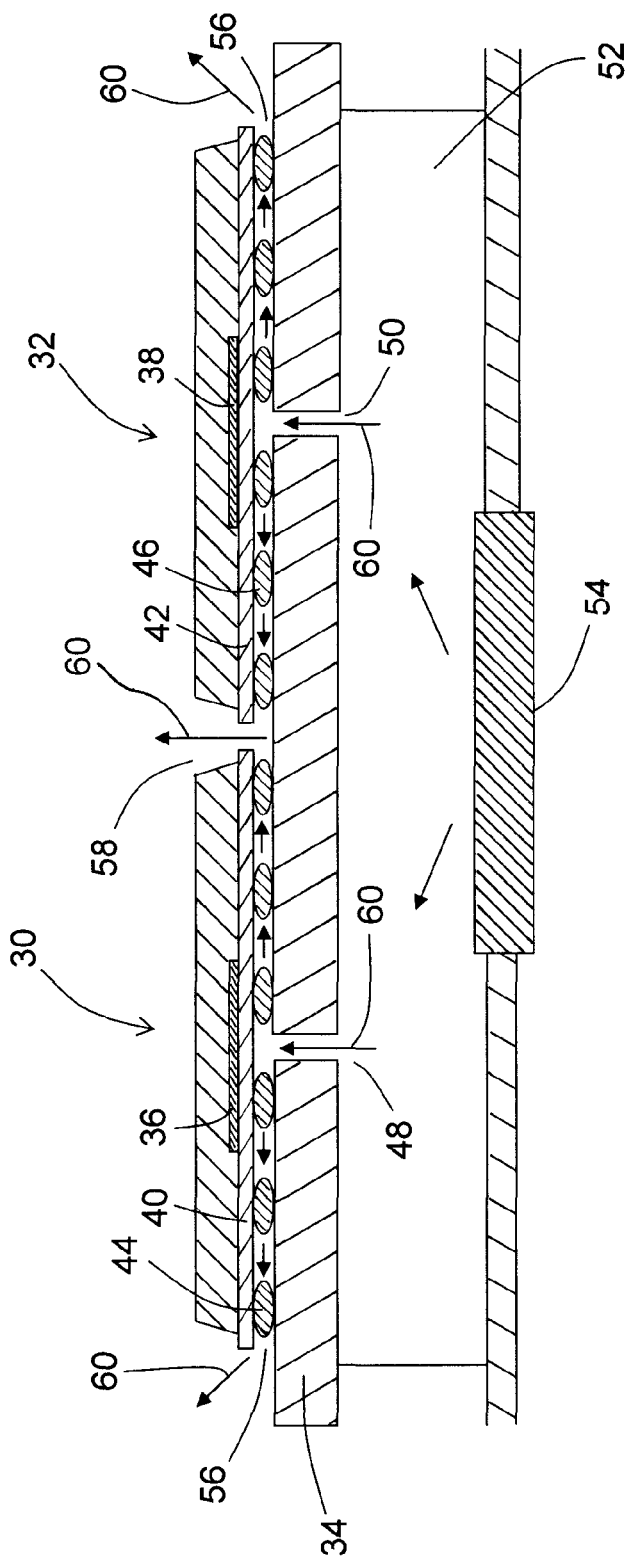
FIG. 2 is a schematic illustration of a preferred embodiment used for the cooling of BGA components.

Electronic circuitry according to the preferred embodiment is shown schematically in cross section in FIG. 2. The figure shows only two components 30 32 attached to a part of the printed circuit board 34, by way of illustration. In fact the electronic circuitry comprises an array of such components positioned on further regions of the printed circuit board having the same structure as that part shown in FIG. 2. Each of the two components shown, and the other components which are not shown, has the same structure as the component 2 shown in FIG. 1. The semiconductor dies 36 38, the rigid laminate structures 40 42, and the solder connections 44 46 of the components 30 32 are shown in FIG. 2.

The printed circuit board 34 includes circular apertures 48 50, each of which is located adjacent to and aligned with a respective one of the components 30 32. The apertures are formed by drilling holes during manufacture of the printed circuit board. In variants of the preferred embodiment the apertures are punched rather than drilled. In further variants, a plurality of apertures are provided aligned with each heat-generating component.

The apertures 48 50 connect the space between the components 30 32 and the printed circuit board 34 with a pressure chamber 52 beneath the printed circuit board 34. A fan 54 or pump is located on the other side of the pressure chamber 52 to the printed circuit board 34. A filter (not shown) associated with the fan 54 or pump is provided to stop pollution or dust particles passing into the pressure chamber 52 and to the printed circuit board. The pressure chamber is integrated into a mechanical support structure (not shown).

The electronic circuitry has further apertures in the form of openings 56 at the sides of the space between the components 30 32 and the printed circuit board, and in the form of an opening 58 between the components 30 32.

The components 30 32 and the printed circuit board 34 are spaced apart by a distance h. The solder connections 44 46 function as spacers between the components 30 32 and the printed circuit board 34 to provide the spacing or standoff distance h. Thus, the components are assembled onto the printed circuit board 34 at a controlled standoff distance h. In the case of the surface-mounted components shown in FIG. 2 (in this case ball grid arrays) the standoff distance is determined by the amount of solder used to make a reliable electrical and mechanical connection.

In the embodiment shown in FIG. 2, the apertures 48 50 have a diameter d. In the example shown in FIG. 2, the distance h is 0.75 mm and the diameter d is 2 mm.

In operation, heat is generated primarily by the semiconductor dies 36 38. Operation of the fan 54 forces air into the pressure chamber 52. The air then passes from the pressure chamber through the apertures 48 50 into the space between the components 30 32 and the printed circuit board 34 and out through the openings 56 58. The flow of air, in operation, is indicated in FIG. 2 by the solid arrows 60. It can be seen that the air approaches the components 30 32 in a direction perpendicular to the plane of the components 30 32 and printed circuit board 34.

As the air passes the components 30 32 it absorbs heat from the components 30 32. The air is expelled through the openings 56 58 and thus expels heat from the components 30 32. The air acts as a coolant fluid.

In operation the pressure chamber 52 acts as a manifold and provides isostatic air pressure to the apertures 48 50, as the apertures are of small diameter.

By injecting the coolant fluid directly into the cavity between the components 30 32 and the printed circuit board 34 it is brought very close to the hot underside of the components 30 32, thus bypassing several thermal resistances.

Furthermore, the fact that the cooling fluid approaches the hot surface from a perpendicular direction causes a jet impingement effect. This increases the heat transfer rate compared to a tangent flow by locally breaking through the thermal boundary layer at the surface.

In addition, in the case of area array components (such as the ball grid array components shown in FIG. 2), the large number of solder connections is directly exposed to the coolant flow, promoting turbulence and increasing the heat exchanging surface area, thus improving heat transfer even further. That feature is illustrated schematically in FIG. 3, which is a schematic top view of the solder connections 44 of one of the components 30.

Figure 3:
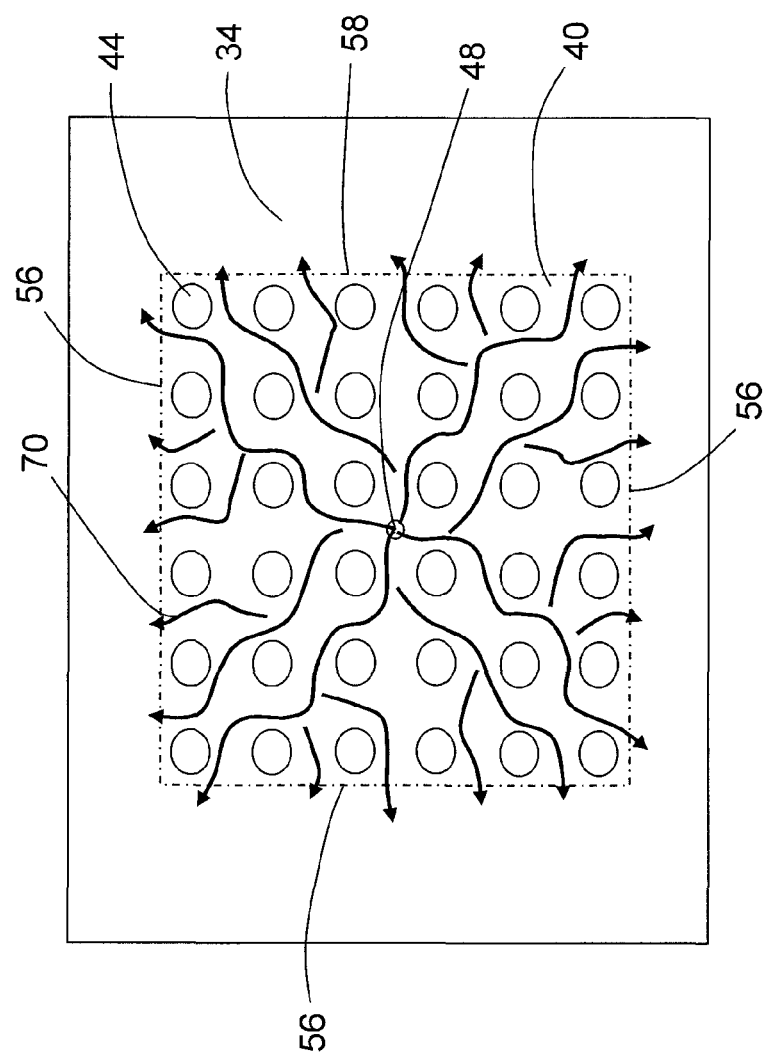
FIG. 3 is an illustration of coolant air flow between a BGA component and a PCB in the embodiment of FIG. 2.

The areas of greatest coolant flow from the aperture 48 to the openings 56 58 is shown in FIG. 3 by the lines 70 for one instant in time. As the coolant flows from the aperture 48 to the openings 56 58 further heat is transferred from the solder connections 44 and the laminate structure 40 to the coolant.

The coolant used in the preferred embodiment is air, however other gases or liquids may be used as the coolant.

The embodiment shown in FIG. 2 forms an open loop coolant fluid circuit, in which fresh (conditioned) air is used to cool the component and the resulting heated air is directly bled into the ambient environment. Thus, the system of FIG. 1 is a one-way, open system in which the air used as coolant fluid is passed by the components a single time, and is not recirculated.

In alternative embodiments, a closed system is used in which returning cooling fluid is cooled in an external heat exchanger. Examples of such embodiments comprise a manifold and a distribution circuit to cycle coolant between the heat exchanger and the individual hot components. In examples of such closed systems components are sealed around their perimeter to keep the coolant contained within the system. In particular, in the case where the system is a closed system and the coolant is a non-dielectric coolant, electrical connections must be outside the sealed perimeter in order to avoid short circuits. However, in embodiments in which dielectric or other liquids are used as the coolant, the sealing around the perimeter of components may not be strictly required, depending for instance on the viscosity or other flow property of the liquid and the orientation of the system.

Figure 4:
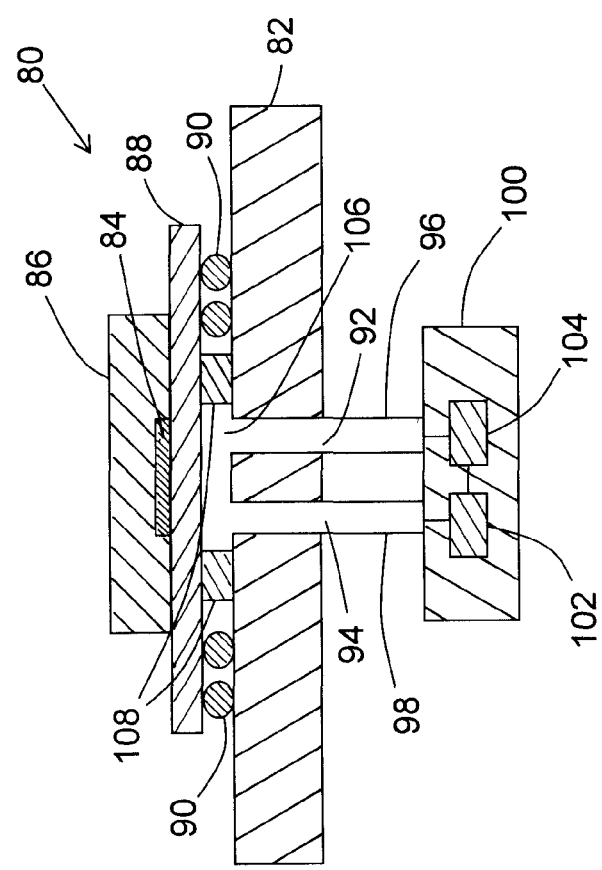
FIG. 4 is a schematic illustration of a variant of the preferred embodiment, which uses a closed loop cooling circuit.

An example of an alternative embodiment including a closed loop heat exchange circuit is shown schematically in FIG. 4. In this case a single component 80 is shown attached to a printed circuit board 82. The component 80 has the same structure as the component 2 shown in FIG. 1 and as the component 30 shown in FIG. 2. The semiconductor die 84, the encapsulation layer 86, the rigid laminate structure 88, and the solder connections 90 of the component are shown in FIG. 4.

The printed circuit board includes an aperture 92 and a further aperture 94, each of which is connected by a respective conduit 96 98 to heat exchange circuitry 100. The heat exchange circuitry 100 includes a heat exchanger 102, a manifold 104, and a pump (not shown).

The aperture 92 and the further aperture 94 lead into a space 106 between the rigid laminate structure 88 of the component 80 and the printed circuit board 82. The space 106 is bounded at the sides by a continuous solder joint 108, such that there is a closed path between the aperture 92 and the further aperture 94. The continuous solder joint 108 of the embodiment of FIG. 4 is formed simultaneously in one reflow step with the solder connections 90.

The heat exchange circuitry 100, the conduits 96 98, the apertures 92 94 and the space 106 form a closed loop heat exchange circuit. In an operating state, coolant fluid is present in the closed loop heat exchange circuit and is circulated to provide a cooling effect.

In operation, heat is generated primarily by the semiconductor die 84. Generated heat is conducted from the semiconductor die through the encapsulation layer 86 to the top surface of the encapsulation layer 84 or down through the component 80 to the bottom surface of the component 80 and through the solder connections 80 and solder joint 108.

In operation the coolant fluid is circulated continuously and repeatedly, by operation of the pump, through the manifold 104, through the conduit 96, in through the aperture 92, through the space 106, out through the further aperture 94, through the conduit 98, through the heat exchanger 102, through the pump and back through the manifold 104.

Heat is transferred from the bottom surface of the component 80, from the solder joint 108, and from the printed circuit board 82 to the coolant fluid as the coolant fluid passes through the space 106. Subsequently, the heat is transferred from the coolant fluid to the heat exchanger 102 as the coolant fluid passes through the heat exchanger 102. The heat is subsequently transferred either directly or indirectly to ambient by the heat exchanger 102 using known heat exchange techniques.

FIG. 4 in particular is a schematic diagram that is not drawn to scale and the relative dimensions of the various features, including the heat exchange circuitry, apertures and conduits, should not be inferred from FIG. 4.

The cooling effect that is provided by the embodiments of FIGS. 2 and 4 depends, in part, on the relative size and location of the apertures and on the spacing h of the printed circuit board 34 or 82 and the component or components 30 32 or 80.

In the embodiments of FIGS. 2 and 4 the solder connections 44 or 90 between the components 30 32 or 80 and the printed circuit board 34 or 82 are of such dimension and composition as to provide simultaneously both desired mechanical and electrical and mechanical connection between the components 30 32 or 80 and the printed circuit board 34 or 82, and a desired spacing between the components 30 32 or 80 and the printed circuit board 34 or 82. Thus, the assembly process for the embodiments of FIGS. 2 and 4 is particularly straightforward.

In other embodiments, the dimensions of the solder connections between the printed circuit board and the components are required to have particular characteristics which means that the required thickness of the solder connections is different from the desired spacing h of the printed circuit board and the components for cooling purposes. In certain such embodiments the shape of the printed circuit board is adapted to provide the desired spacing in the region of the aperture. An example of such an embodiment is illustrated schematically in FIG. 5.

Figure 5:
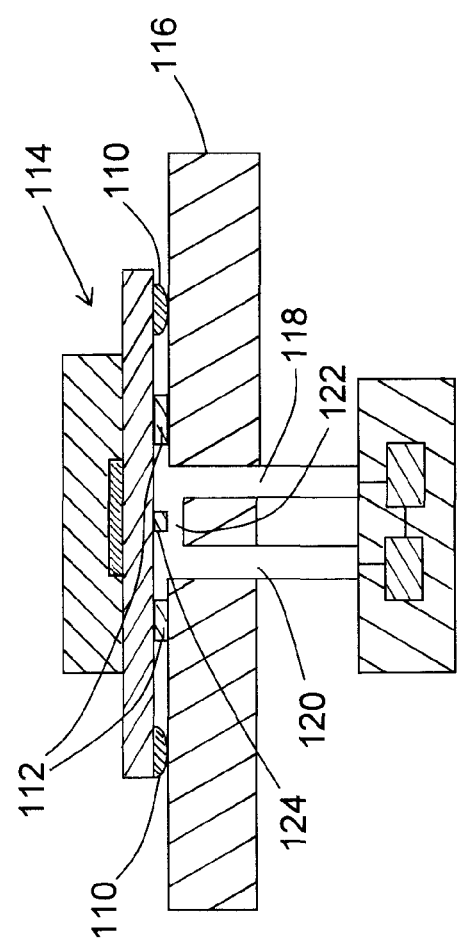
FIG. 5 is a schematic illustration of an alternative embodiment.

The embodiment of FIG. 5 is similar to that of FIG. 4, but the solder connections 110 and the solder joint 112 have a thickness which is less than the desired spacing h of the component 114 and the printed circuit board 116. In order to provide the desired spacing h in the region of the aperture 118, the thickness of the printed circuit board 116 is reduced in the region 122 between the aperture 118 and the further aperture 120.

A further difference between the embodiment of FIG. 5 and that of FIG. 4 is that an additional structure 124 is included on the surface of the component 114. The additional structure 124 acts to improve heat transfer from the component 114 to the coolant fluid by channeling the coolant fluid flow and by increasing the surface area in contact with the coolant fluid in operation. In the embodiment of FIG. 5, the additional structure 124 is formed of solder during the reflow step, but in variants of the embodiment other materials may be used.

In further embodiments various other raised structures may be included on the printed circuit board or on the component in the region between the printed circuit board and the component in order to improve heat transfer by channeling the coolant fluid flow and/or by increasing the surface area in contact with the coolant fluid in operation.

FIGS. 2 to 5 which have been used to illustrate the structure and operation of various embodiments have shown either one or two components mounted on a region of a printed circuit board, together with associated apertures. In fact in many embodiments a large number (for instance 100 to 1000) of components are mounted on the printed circuit board, each having an associated aperture. The cooling effects provided by the described embodiments are particularly useful in the case when a large number of heat-generating components are mounted on a single circuit board and/or when space is restricted making the use of conventional techniques particularly disadvantageous.

Figure 6:
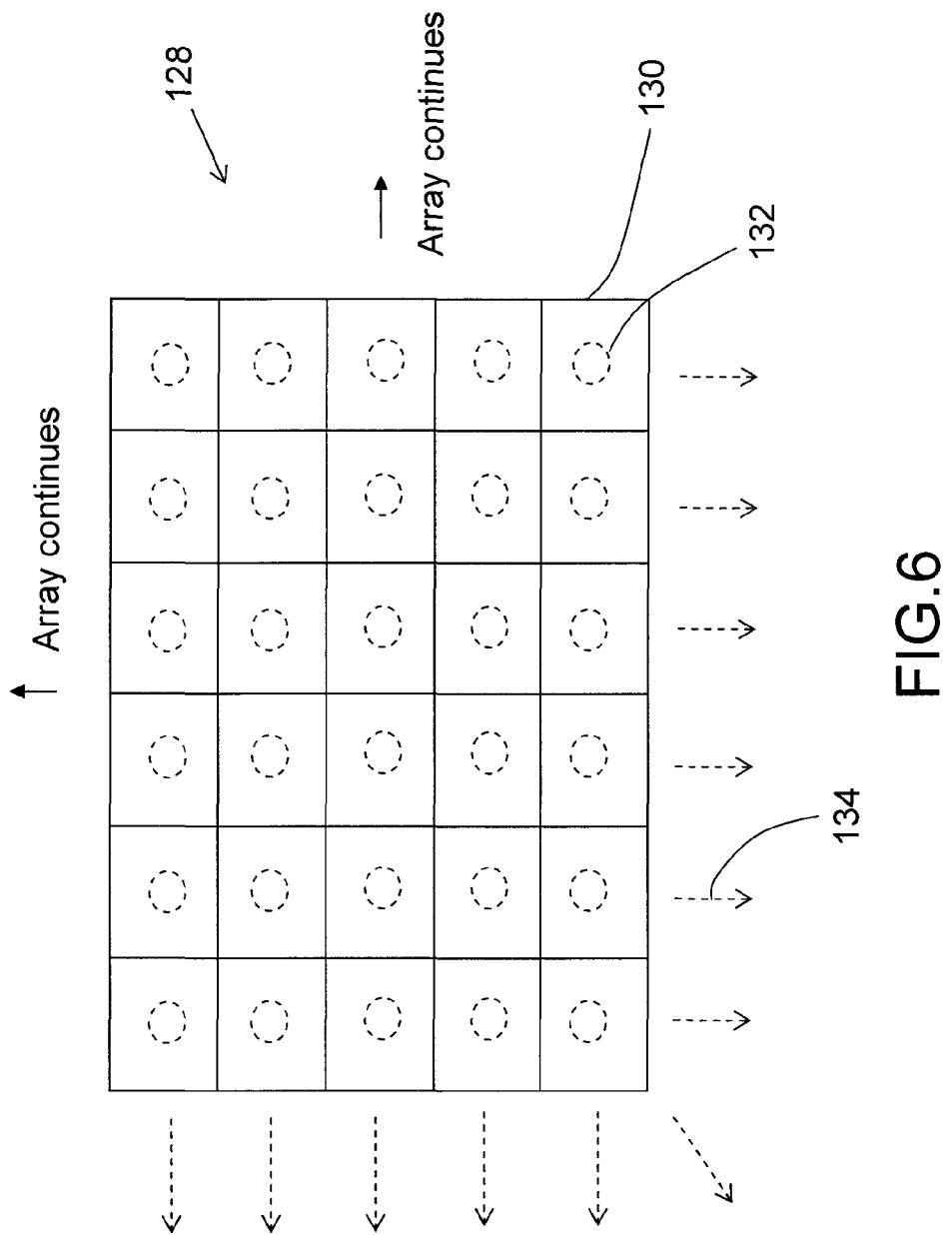
FIG. 6 is a schematic illustration of a further embodiment.

An example of a further embodiment directed to the cooling of a large number of electronic components is illustrated schematically in FIG. 6. The embodiment includes an array 128 of electronic components 130, and part of such an array 128 is shown in FIG. 6 in a planar view, from the front. The electronic components 130 are mounted on a printed circuit board (not shown), with a spacing between the PCB and electronic components 130. An array of apertures 132 is provided in the PCB and the position of the apertures 132 is shown schematically in FIG. 6 by the dashed circles 132 (not drawn to scale).

The embodiment of FIG. 6 includes an open loop coolant fluid circuit such as that illustrated in FIG. 2. The circuit includes a pressure chamber located beneath the PCB, with a fan located on the far side of the pressure chamber from the PCB. In operation, air is passed into the pressure chamber by the fan, passes through the apertures 132 and passes by the electronic components 130 where it absorbs heat from the electronic components 130. The air leaves the apparatus through the spacing between the PCB and the array 128 of electronic components 130 at the sides of the array 128, as indicated by the dashed arrows 134.

In an alternative embodiment, a closed loop cooling circuit such as that illustrated in FIG. 4 is used to cool an array of components such as that shown in FIG. 6.

In further embodiments cooling systems such as those described above are used to cool other high-end electronic applications, for instance computing centres, multi-core processing boards, or telecom base stations.

Each of the embodiments is constructed using standard methods of construction of electronic circuitry. That includes in particular, but is not restricted to, electronic circuitry constructed using area array component techniques, such as Ball Grid Array (BGA), Land Grid Array (LGA), Pin Grid Array (PGA), Stud Bump Array (SBA), or Quad Flat-No Leads (QFN) techniques.

Figure 7:
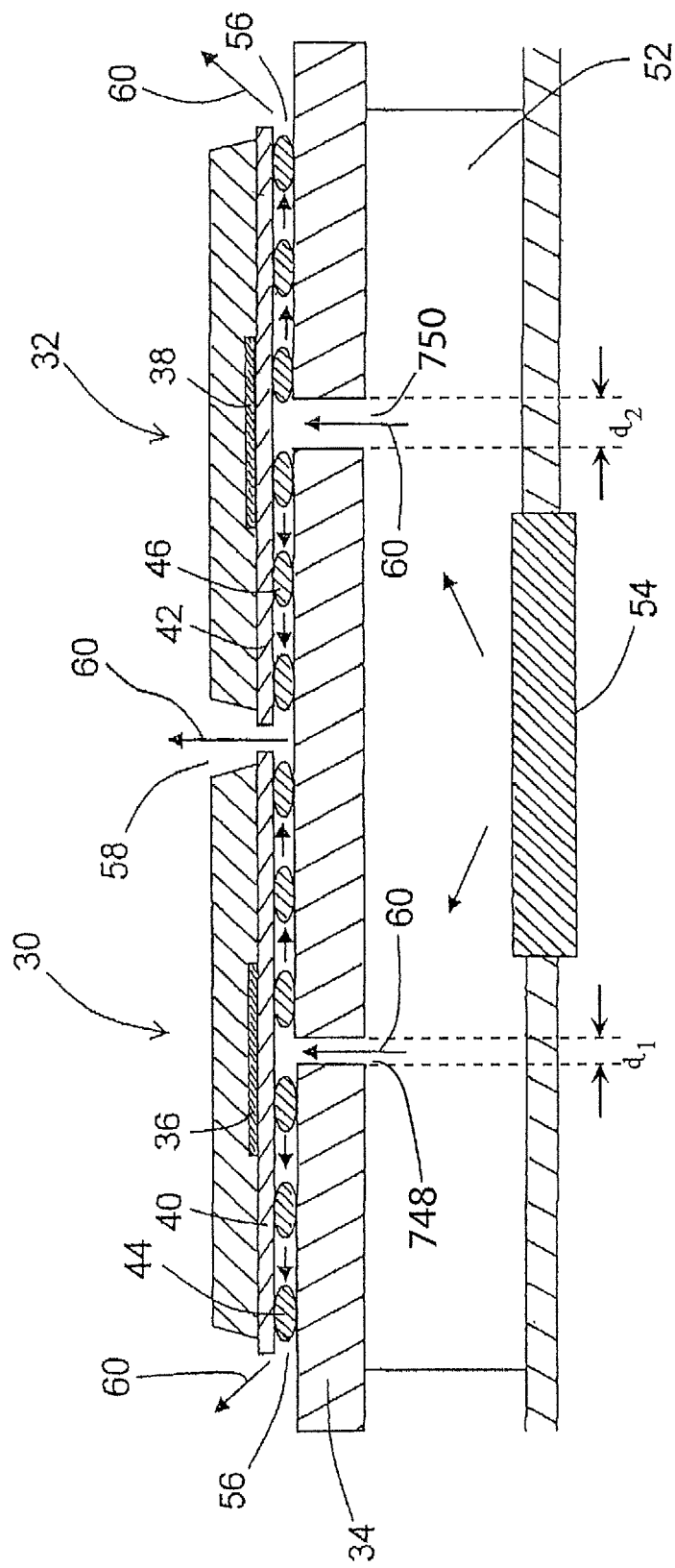
FIG. 7 is a schematic illustration of another embodiment.

In the embodiments described above, each aperture is the same size. In variants of the embodiments, such as indicated in FIG. 7, different sized apertures 748, 750 are provided in dependence upon the amount of heat which is expected to be generated in use by the respective component 30, 32 adjacent to each aperture 748, 750 and/or in dependence upon the desired temperature of the component 30, 32. So, if a component 32 is expected to generate more heat than average a larger than average aperture 750 is provided adjacent to that component 32, and if a component 30 is expected to generate less heat than average, a smaller than average aperture 748 is provided adjacent to that component 30. Thus, in use, a greater flow of coolant can be provided past those components 32 expected to generate most heat, and a lesser flow of coolant can be provided past those components 30 expected to generate least heat.

Figure 8:
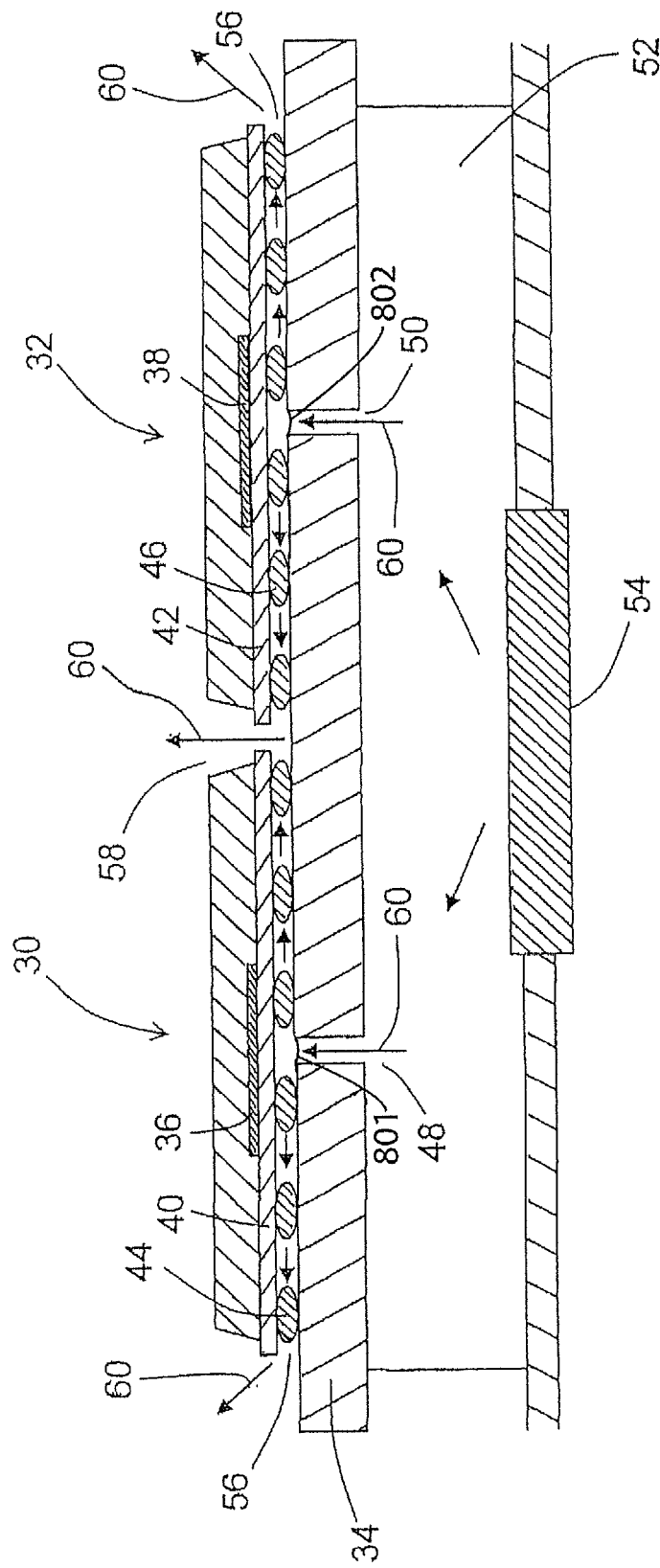
FIG. 8 is a schematic illustration of yet another embodiment.

In one variant, the apertures are drilled to have different sizes. In another variant, the apertures are drilled to each be of the same size, and then various apertures are partially blocked in order to provide apertures of different sizes. In a further variant, as shown in FIG. 8, a respective shutter arrangement 801, 802 is provided for each aperture 48, 50 and the diameter of each aperture 48, 50 is selectively varied during use to immediately vary airflow 60 and thus cooling performance in dependence upon the operation and/or temperature of the associated heat-generating component 30, 32. That variant is particularly useful in the case where the electronic circuitry comprises a central processing unit (CPU), for which the amount of heat generated depends on the number of computing operations being performed and varies over time.

In one variant, the apertures are drilled to have different sizes. In another variant, the apertures are drilled to each be of the same size, and then various apertures are partially blocked in order to provide apertures of different sizes. In a further variant, a respective shutter arrangement is provided for each aperture and the diameter of each aperture is selectively varied during use to immediately vary airflow and thus cooling performance in dependence upon the operation and/or temperature of the associated heat-generating component. That variant is particularly useful in the case where the electronic circuitry comprises a central processing unit (CPU), for which the amount of heat generated depends on the number of computing operations being performed and varies over time.

In further variants, the respective spacing between each aperture and its associated heat-generating component is selected in dependence upon the heat that is expected to be generated by that component in use, and/or the desired temperature of the component. Alternatively or additionally, a plurality of pressure chambers rather than a single pressure chamber are provided, each pressure chamber linked to a respective one or more apertures. The operating conditions of the pressure chambers may be selected in dependence upon the amount of heat to be generated in use by the associated components. Thus, other ways are provided to ensure that, in use, a greater flow of coolant can be provided past those components expected to generate most heat, and a lesser flow of coolant can be provided past those components expected to generate least heat.

It will be understood that the present invention has been described above purely by way of example, and modifications of detail can be made within the scope of the invention.

Each feature disclosed in the description, and (where appropriate) the claims and drawings may be provided independently or in any appropriate combination.

The invention claimed is:

1. Electronic circuitry comprising:
   a circuit board and at least one component mounted on the circuit board, the at least one component generating heat in use,
   the circuit board including at least one aperture aligned with the component or a respective one of the components, and the electronic circuitry being configured to provide, in use, a path for coolant fluid to flow through the at least one aperture and past the at least one component, the electronic circuitry being characterized in that it further comprises at least one opening providing a path to an ambient environment, wherein the at least one aperture and the at least one opening are arranged so that coolant fluid can flow in through the at least one aperture and out through the at least one opening thereby permitting the coolant to bleed into the ambient, and wherein a shutter is provided for the at least one aperture for varying a size of the at least one aperture.

2. Electronic circuitry according to claim 1, comprising a plurality of components that generate heat in use and a plurality of apertures, wherein each of the plurality of apertures is aligned with a respective one of the plurality of components.

3. Electronic circuitry according to claim 1, wherein the at least one aperture comprises a plurality of apertures and at least some of the apertures have different sizes, the size of each aperture selected in dependence upon the rate of heat generation in use expected for the respective component with which the aperture is aligned.

4. Electronic circuitry according to claim 1, wherein the position of the at least one aperture is such as to provide, in use, greater flow of coolant fluid past the at least one component with which the at least one aperture is aligned than past other parts of the electronic circuitry.

5. Electronic circuitry according to claim 1, wherein the at least one component is spaced apart from the circuit board by a pre-determined spacing selected in dependence upon one or more of an expected rate of heat generation of the component in use or a rate of coolant flow past the component.

6. Electronic circuitry according to claim 1, further comprising at least one spacer for spacing the at least one component apart from the circuit board by a pre-determined spacing.

7. Electronic circuitry according to claim 6, wherein the at least one spacer comprises at least one electrical or mechanical connection between the at least one component and the circuit board.

8. Electronic circuitry according to claim 5, wherein a shape of the circuit board is shaped to provide a desired spacing in a region of the at least one aperture.

9. Electronic circuitry according to claim 5, wherein the respective pre-determined spacing for the at least one component is selected in dependence upon the expected rate of heat generation of the component in use.

10. Electronic circuitry according to claim 5 wherein the pre-determined spacing between the at least one component and the circuit board is between 0.1 mm and 5 mm.

11. Electronic circuitry according to claim 1, wherein a diameter of the at least one aperture is between 0.1 mm and 10 mm.

12. Electronic circuitry according to claim 1, wherein the position of the at least one aperture is such that, in use, coolant fluid passing through the aperture approaches a surface of the component with which the at least one aperture is aligned from a perpendicular direction.

13. Electronic circuitry according to claim 1, wherein the electronic circuitry comprises an area array arrangement for mounting the at least one component on the circuit board, selected from a set consisting of a ball grid array (BGA), a land grid array (LGA), a pin grid array (PGA), a stud bump array (SBA), or a quad flat-no leads (QFN) array.

14. Electronic circuitry according to claim 1, arranged so that in use the at least one heat-generating component dissipates heat primarily through a side of the component facing the circuit board.

15. A method of producing electronic circuitry comprising providing a circuit board,
producing at least one aperture in the circuit board,
providing a shutter for the at least one aperture for varying a size of the at least one aperture,
producing at least one opening providing a path to an ambient environment,
wherein the at least one aperture and the at least one opening are arranged so that coolant fluid can flow in through the at least one aperture and out through the at least one opening and thereby permit the coolant to bleed into the ambient environment, and
mounting at least one component on the circuit board,
the at least one component generating heat in use and the at least one aperture having a position on the circuit board such that each of the at least one apertures is aligned with a respective one of the mounted components and such that, in use, a path for coolant fluid to flow through the at least one aperture and past the at least one component is provided,
wherein the step of mounting the at least one component comprises positioning the at least one component on the circuit board and reflowing portions of solder in order to provide an electrical connection between the at least one component and the circuit board, and the portions of solder are such that after reflowing the portions of solder provide a desired spacing between the circuit board and the at least one component.

16. The method according to claim 15, wherein the step of producing the at least one aperture comprises drilling or punching at least a hole in the circuit board before mounting the at least one component.

* * * * *